United States Patent [19]

Ghanayem et al.

[11] Patent Number: 5,709,772
[45] Date of Patent: Jan. 20, 1998

[54] NON-PLASMA HALOGENATED GAS FLOW TO PREVENT METAL RESIDUES

[75] Inventors: Steve Ghanayem, Sunnyvale; Moris Kori, Palo Alto; Maitreyee Mahajani, Santa Clara; Ravi Rajagopalan, Sunnyvale, all of Calif.

[73] Assignee: Applied Materials, Inc., Santa Clara, Calif.

[21] Appl. No.: 625,485

[22] Filed: Mar. 29, 1996

[51] Int. Cl.⁶ .......................... H01L 21/306; C23F 1/00
[52] U.S. Cl. ........................ 156/646.1; 156/654.1; 134/1.3; 118/725; 216/37
[58] Field of Search ...................... 156/646.1; 134/1.3; 118/725; 216/37

[56] References Cited

U.S. PATENT DOCUMENTS

| | | | |
|---|---|---|---|
| 4,617,087 | 10/1986 | Iyer et al. | 156/643 |
| 5,164,330 | 11/1992 | Davis et al. | 437/192 |
| 5,462,603 | 10/1995 | Murakami | 118/719 |
| 5,516,367 | 5/1996 | Lei et al. | 118/725 |
| 5,520,742 | 5/1996 | Ohkase | 118/724 |
| 5,533,635 | 7/1996 | Man | 216/67 |
| 5,534,066 | 7/1996 | O'Neil et al. | 118/663 |

*Primary Examiner*—R. Bruce Breneman
*Assistant Examiner*—Michael E. Adjodha
*Attorney, Agent, or Firm*—Townsend and Townsend and Crew LLP

[57] ABSTRACT

An apparatus and process for limiting residue remaining after the etching of metal in a semiconductor manufacturing process by injecting a halogen-containing gas without a plasma into a processing chamber. The wafer is then exposed to the remnants of the halogen-containing gas in the chamber before the metal is deposited on the wafer. The exposure can occur in the same chamber as the metal deposition, or a different chamber. The wafer can remain in the chamber or be moved to another chamber for etching after exposure and deposition.

14 Claims, 2 Drawing Sheets

NON-PLASMA HALOGENATED GAS FLOW TO PREVENT METAL RESIDUES

BACKGROUND OF THE INVENTION

The present invention relates to metal deposition on semiconductor substrates in semiconductor processing systems, and in particular to the elimination of residue remaining after the etching of the metal.

One of the steps in the formation of a semiconductor chip is the creation of metal interconnections between devices on a semiconductor wafer. Typically, this is done by first depositing a layer of metal, such as tungsten, across the wafer. In one process, tungsten is deposited in a chemical vapor deposition (CVD) chamber by reacting $WF_6$ containing the tungsten and $H_2$ or Silane at elevated temperatures over a wafer sitting on a resistive heater (alternately, other methods may be used to heat the wafer, such as lamps). The process temperature is typically 475° C. Subsequently, the tungsten is etched away except for areas in which metal interconnections are desired. This may be done in the same chamber or by moving the wafer to a separate chamber.

It has been discovered that under certain processing conditions, when the wafer is later etched, tungsten residue remains on the wafer, which can form shorts in the interconnects. Although the process is not completely understood, it is believed that tungsten may preferentially grow in certain spots on the wafer (These spots may be areas where residue has formed as a result of previous processing steps). The preferentially growing tungsten may be in a different phase than other areas of the metal tungsten layer. Because the tungsten is in a different phase, these areas may then etch away at a different rate, leaving the undesirable tungsten residue in areas where there should be no interconnect after the etch step.

One approach to eliminate the residue is to clean the chamber in which the metal layer is deposited after every wafer is processed. This is typically done by removing the wafer, and then igniting a plasma composed of $NF_3$, followed by a hydrogen plasma, with a subsequent argon gas purge. After this cleaning step, the next wafer can be inserted into the chamber for depositing of the tungsten layer without significant residue being present after etchback. A drawback of this plasma clean approach is that it requires a significant amount of time between each wafer being processed. One approach would be to do the plasma less often. But it has been discovered, for example, that a plasma clean after every 25 wafers is not sufficient since residue formation still occurs.

Accordingly, it would be desirable to have an improved process for eliminating residue formation after tungsten deposition and etchback which does not significantly impact wafer throughput.

SUMMARY OF THE INVENTION

The present invention provides an apparatus and process for limiting residue remaining after the etching of metal in a semiconductor manufacturing process by injecting a halogen-containing gas without a plasma into a processing chamber. The wafer is then exposed to the remnants of the halogen-containing gas in the chamber before the metal is deposited on the wafer. The exposure can occur in the same chamber as the metal deposition, or a different chamber. The wafer can remain in the chamber or be moved to another chamber for etching after exposure and deposition.

In one preferred embodiment, the halogen-containing gas is $NF_3$, although other gases, such as $C_2F_6$, $CF_4$, $ClF_3$, or $Cl_2$ may be used. Preferably, the halogen gas is injected for less than 30 seconds and at a rate of between 10-2000 sccm (more preferably between 10-150 sccm) with a pressure between 50 milliTorr (mT) and 90 Torr (T) (more preferably, between 50 mT and 10 T). In one preferred embodiment, either a fluorine-containing gas or a chlorine-containing gas is used.

The present invention eliminates the need for igniting a plasma, and also eliminates the need for high flows of gases, and optionally the need to remove the wafer before injecting the halogen-containing gas.

For a further understanding of the nature and advantages of the invention, reference should be made to the ensuing description taken in conjunction with the accompanying drawings.

DESCRIPTION OF THE PREFERRED EMBODIMENTS

Figure 1:
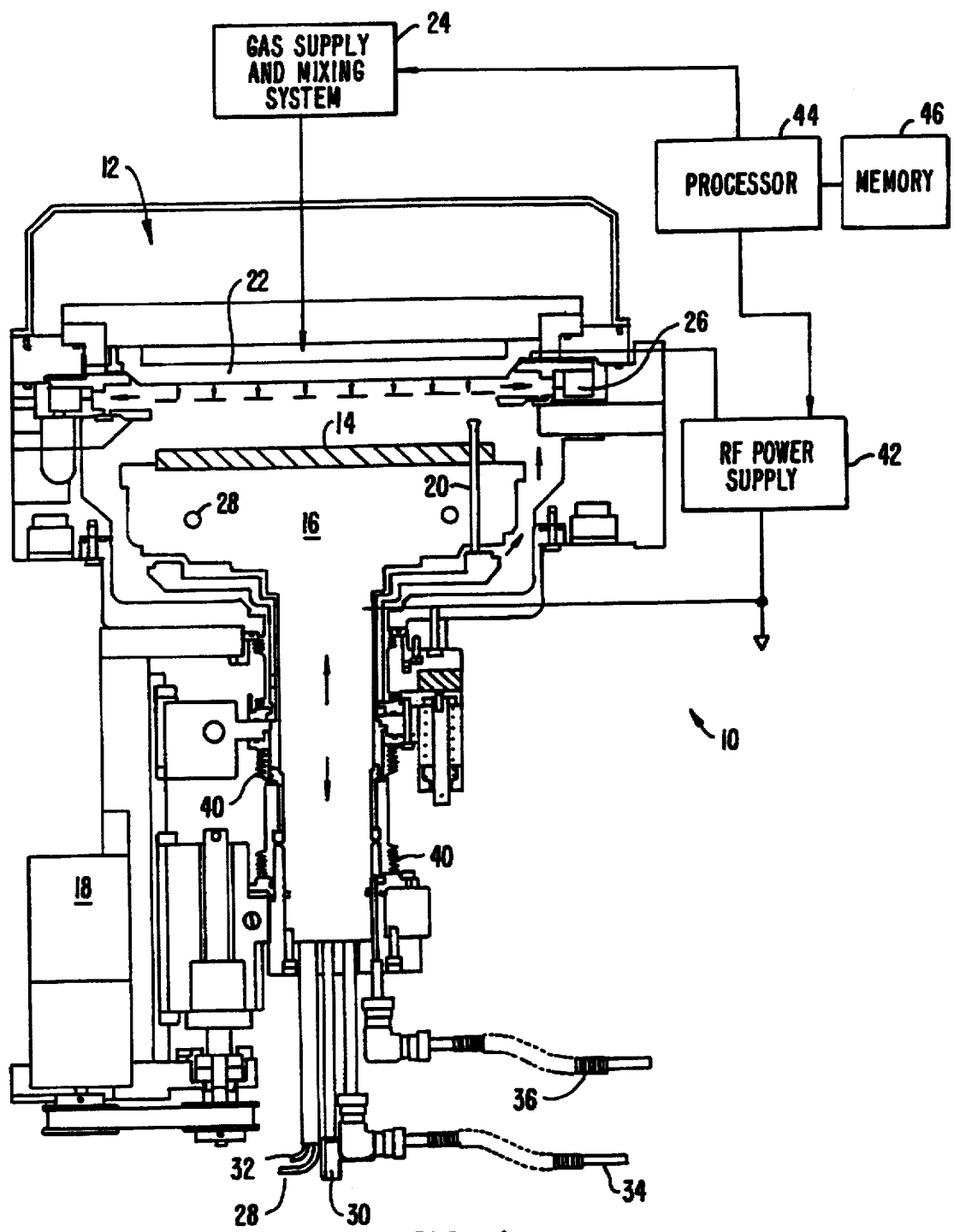
FIG. 1 is a diagram of a semiconductor wafer processing system used in one embodiment of the present invention.

One suitable system for carrying out the present invention is shown in FIG. 1, which is a diagram of a semiconductor substrate processing system 10 including a cross-sectional view, partially schematic, of a CVD chamber 12. A substrate 14 is shown sitting on a heater mount 16. The substrate is brought into chamber 12 by a robot blade through a slit valve in the sidewall of the chamber (not shown). Chamber 12 may be part of a vacuum processing system having a plurality of processing chambers connected to a central transfer chamber. The heater mount 16 is movable vertically using a motor 18. The substrate 14 is brought into the chamber when the heater mount 16 is in a first position opposite the slit valve. The substrate 14 is supported initially by a set of pins 20 that pass through the heater mount 16. When the heater mount 16 is raised to a processing position, the wafer is lifted off of the pins. A gas distribution plate 22 provides process gases into chamber 12. Gases are provided from a gas supply and mixing system 24. An exhaust system 26 evacuates the reaction byproducts and unreacted gases.

Wafer 14 is heated during the process by a resistive coil 28 embedded in the heater mount 16. Coil 28 exits the heater mount 16 at the bottom of FIG. 1 and is connected to an external power supply (not shown). The bottom of FIG. 1 also shows a thermocouple connection 30 for measuring the temperature of the heater mount 16. Also shown is a vacuum line 32 which connects to recesses (not shown) on the top of heater mount 16 for holding wafer 14 in place.

A pair of purge lines, 34 and 36 are shown for providing purge gases. Purge gas line 34 provides a purge gas which comes up around the edges of heater mount 16 and past purge guide 38, which will form a small gap between it and wafer 14 in the processing position. This purge gas prevents any tungsten from depositing on the backside or edges of wafer 14. Additional purge line 36 is used to keep any residue from collecting around stainless steel bellows 40 which provide a barrier between the mechanical mechanisms and the chamber interior.

The process performed in chamber 12 can either be a CVD process, or a plasma enhanced CVD (PECVD) process. In a PECVD process, RF power is applied between gas distribution plate 22 and heater mount 16 by an RF power supply 42. Typically, heater mount 16 is grounded, with the positive voltage being applied by a strap to a support plate for gas distribution plate 22. RF power supply 42 can supply either single or mixed RF power to enhance the decomposition of reactive species introduced into chamber 12.

A processor 44 controls the operation of the chamber, in particular the RF power supply and the gas supply and mixing system 24. The processor uses a memory 46 which stores a program containing instructions for operation of the system. In addition, the processor can control a gas injection source through gas mixing system 24. The processor also controls the purge lines, a vacuum pump connected to the vacuum lines for holding the wafer, and the vacuum exhaust system. The processor also receives a signal from the thermocouple 30 to provide feedback for control of the power supply connected to coil 28 for providing the desired temperature through resistive heating. Additionally, processor 44 can control motor 18 for moving the heater mount 16 as desired, as well as the robot arm (not shown).

Figure 2:
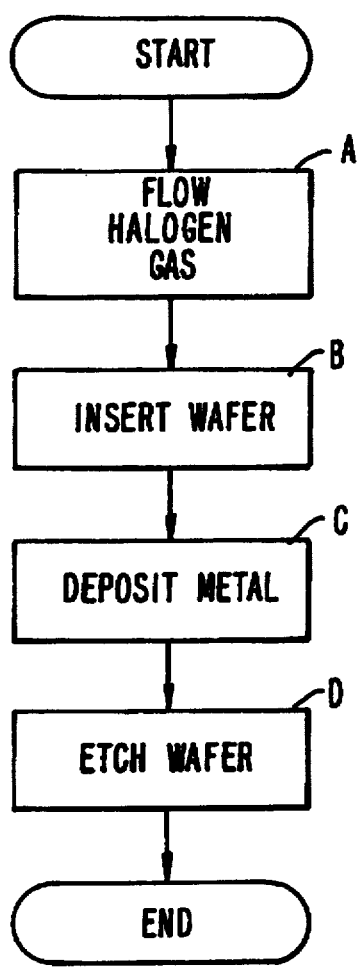
FIG. 2 is a flowchart of a process according to an embodiment of the present invention.

FIG. 2 is a flowchart illustrating the present invention used in the chamber of FIG. 1. It should be understood that other chambers or systems could be used to implement the present invention. First, halogen-containing gas is flowed to the chamber by a command from the processor 44 to the appropriate valves in gas supply and mixing system 24 (step A). Subsequently, a wafer is inserted into the chamber by a robot arm under control of the processor (step B). Next, a layer of metal, preferably tungsten, is deposited on the wafer (step C). Next, the wafer is etched, either in the same chamber or in a different chamber or different system (step D).

Figure 3:
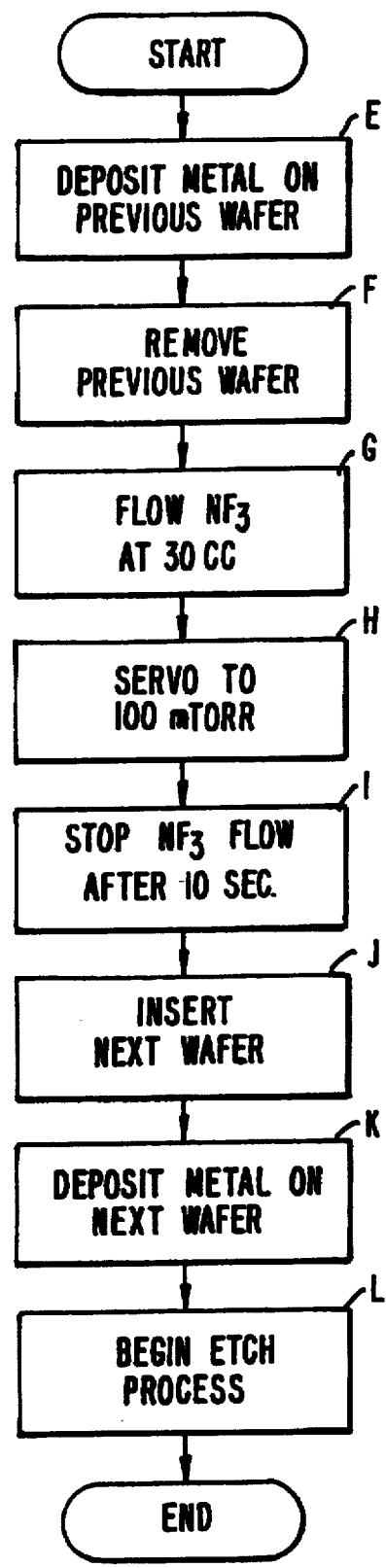
FIG. 3 is a more detailed version of the flowchart of FIG. 2.

FIG. 3 is a more detailed flowchart of a preferred embodiment of the present invention. After depositing the metal on the previous wafer in the chamber (step E), the previous wafer is removed (step F). $NF_3$ is then flowed at a flow rate of approximately 30 sccm by control of a valve in the gas supply and mixing system by the processor (step g). Alternately, flow rates between 10 and 2000 sccm or more preferably between 10 and 150 sccm may be used, as controlled by an instruction in memory 46 executed by processor 44.

During this flow, the chamber pressure is controlled to a preferred value of approximately 100 mT by using feedback control of a step motor controlling a vacuum valve to a pressure set by the processor (step H). Alternately, pressures between 50 mT and 90 T or more preferably between 50 mT and 10 T may be used, as directed by an instruction in the program memory. The feedback control is accomplished by controlling a servo valve on the vacuum system so that the gas being introduced is evacuated at a rate which provides the desired pressure.

After approximately 10 seconds, the flow of $NF_3$ is stopped (step I). Alternately, the flow of $NF_3$ may be maintained for anywhere from 2–30 seconds, as directed by an instruction in the program memory. The next wafer is then introduced into the chamber (step J) and metal is deposited (Step K). Subsequently, the etch process is performed (step L).

Alternately, other fluorinated or chlorinated gases such as $ClF_3$, $C_2F_6$, $CF_4$, $Cl_2$, etc. may be used. In addition, the wafer may be etched in the same chamber or a different chamber and the $NF_3$ gas may be injected either with the wafer in the chamber or with the wafer outside of the chamber.

It is the exposure of the wafer to the $NF_3$ gas before the depositing of the tungsten layer which prevents residue from remaining after the subsequent etching step: Although the exact mechanism is not completely understood, it is believed that the $NF_3$ may adsorb on the surface over certain sites where tungsten preferentially grows.

The $NF_3$ residues which have been absorbed on the wafer surface thus apparently prevent out-of-phase growth of tungsten on that particular wafer being processed. Thus, the $NF_3$ injection step of the present invention will prevent residue from affecting a subsequently introduced wafer into the chamber.

Alternate embodiments of the invention are also possible. For instance, instead of the halogen gas flow being injected before every wafer, the processor could control the gas supply and mixing system to inject the halogen gas before every second, third, fourth, fifth or other number of wafers (or before such numbers of wafer). In addition to the $NF_3$ flow of the present invention, a plasma clean operation can still be performed under control of the processor after a number of wafers have been processed, for instance, 25.

As will be understood by those with skill in the art, the present invention may be embodied in other specific forms without departing from the spirit or essential characteristics thereof. For example, lamp-heated chambers could be used instead of resistively-heated chambers for processing the wafers. Accordingly, the above description is intended to be illustrative, but not limiting, of the scope of the invention which is set forth in the following claims.

What is claimed is:

1. A process for preventing residue formation after the etchback of metal in a semiconductor manufacturing process, comprising the steps of:
   injecting a halogen-containing, non-metal-containing gas without a plasma into a processing chamber;
   exposing a semiconductor wafer to remnants of said gas;
   depositing a layer of metal on said semiconductor wafer; and
   etching said layer of metal.

2. The process of claim 1 wherein said gas further comprises chlorine.

3. The process of claim 1 wherein said halogen containing, non-metal-containing gas is injected before said wafer is inserted into said processing chamber.

4. The process of claim 1 wherein said gas is injected into said processing chamber, and subsequently metal is deposited on said wafer in said same processing chamber.

5. The process of claim 1 wherein said layer of metal comprises tungsten.

6. The process of claim 1 wherein said halogen-containing, non-metal-containing gas comprises $NF_3$.

7. A process for preventing residue formation after the etchback of metal in a semiconductor manufacturing process, comprising the steps of:
   injecting a gas comprising $NF_3$ without a plasma into a processing chamber;
   exposing a semiconductor wafer to remnants of said $NF_3$;
   depositing a layer of metal on said semiconductor wafer; and
   etching said layer of metal.

8. The process of claim 7 wherein said $NF_3$ is injected for 2–30 seconds.

9. The process of claim 7 wherein said $NF_3$ is injected at a rate of 10–2000 sccm.

10. The process of claim 7 wherein said $NF_3$ is injected at a pressure between 50 millitorr and 90 torr.

11. The process of claim 7 wherein said halogen-containing, non-metal-containing gas further comprises chlorine.

12. A process for preventing residue formation after the etchback of metal in a semiconductor manufacturing process, comprising the steps of:

injecting $NF_3$ gas without a plasma into a processing chamber, said injecting step including injecting said $NF_3$ gas at a flow rate of 10-2000 sccm, injecting said $NF_3$ gas for 2-30 seconds, and injecting said $NF_3$ gas at a pressure between 50 millitorr and 90 torr;

exposing said wafer to remnants of said $NF_3$ gas;

depositing a layer of tungsten on a semiconductor wafer; and etching said layer of tungsten.

13. The process of claim 12 wherein said $NF_3$ gas is injected at a flow rate of 10-150 sccm and a pressure between 50 millitorr and 10 torr.

14. The process of claim 12 wherein said $NF_3$ gas is injected before said wafer is inserted into said processing chamber.

* * * * *